United States Patent [19]

Shay et al.

[11] 4,196,263

[45] Apr. 1, 1980

[54] SEMICONDUCTOR DEVICES WITH ENHANCED PROPERTIES

[75] Inventors: Joseph L. Shay, Marlboro; Sigurd Wagner, Holmdel, both of N.J.

[73] Assignee: Bell Telephone Laboratories, Incorporated, Murray Hill, N.J.

[21] Appl. No.: 951,315

[22] Filed: Oct. 13, 1978

Related U.S. Application Data

[63] Continuation of Ser. No. 793,279, May 3, 1977, abandoned.

[51] Int. Cl.$^2$ .................. H01M 6/30; H01M 6/36
[52] U.S. Cl. .................................. 429/111; 357/15; 357/16; 357/30
[58] Field of Search ................ 429/111; 357/15, 16, 357/30; 136/89 SJ

[56] References Cited

U.S. PATENT DOCUMENTS

| | | | |
|---|---|---|---|
| 3,478,214 | 11/1969 | Dillman | 250/211 |
| 3,508,126 | 4/1970 | Newman et al. | 317/235 |
| 3,990,101 | 11/1976 | Ettenberg | 357/30 |
| 4,011,149 | 3/1977 | Nozik | 204/129 |
| 4,021,833 | 5/1977 | Gurnee | 357/15 |
| 4,053,918 | 10/1977 | Fletcher et al. | 357/30 |
| 4,090,933 | 5/1978 | Nozik | 204/129 |
| 4,094,751 | 6/1978 | Nozik | 204/80 |

OTHER PUBLICATIONS

P. A. Kohl et al., "Semiconductor Electrodes-XI, Behavior of N and P-Type Single Crystal Semiconductors Covered with Thin N-TiO$_2$ Films", *J. Electrochem. Soc.*, vol. 124, pp. 225-229 (1977).

Anon., *Chemical & Engineering News*, Apr. 26, 1976, p. 29.

F. Mollers et al., "On the Origin of the Photocatalytic Deposition of Noble Metals on TiO$_2$", *J. Electrochem. Soc.*, vol. 121, pp. 1160-1167 (1974).

A. Yoshikawa et al., "Electrical & Photovoltaic Properties of CdS-GaAs Junctions", *Japan J. Appl. Phys.*, vol. 14, pp. 1547-1554 (1975).

A. J. Nozik, "p-n Photoelectrolysis Cells", *Appl. Phys. Lett.*, vol. 29, pp. 150-152 (1976).

H. Morisaki et al., "Photoelectrolysis of H$_2$O with TiO$_2$ Covered Solar-Cell Electrodes", *Appl. Phys. Lett., vol. 29, pp. 338-346 (1976).*

*Primary Examiner*—Aaron Weisstuch
*Attorney, Agent, or Firm*—Bruce S. Schneider

[57] ABSTRACT

The voltage produced by a photovolatic device containing a semiconductor layer is enhanced by interfacing the semiconductor material of the device with an additional semiconductor material to form an isotype heterodiode. For example, the solar power conversion efficiency and the voltage produced by an n-CdS layer immersed in an electrolyte is enhanced by interfacing the n-CdS layer with an n-GaAs layer.

8 Claims, 10 Drawing Figures

ELECTROLYTIC DEVICE MEASUREMENTS

SOLID STATE DEVICE MEASUREMENT

ELECTROLYTIC DEVICE MEASUREMENTS

SEMICONDUCTOR DEVICES WITH ENHANCED PROPERTIES

This is a continuation of application Ser. No. 793,279, filed May 3, 1977, now abandoned.

BACKGROUND OF THE INVENTION

1. Field of the Invention

The invention relates to semiconductor devices and particularly to photovoltaic devices.

2. Description of the Prior Art

Many types of devices utilizing semiconductor materials have been developed for photovoltaic applications. Homodiodes, heterodiodes, electrolytic cells and Schottky barriers are exemplary of the different device types used. Each has its relative merits and disadvantages. However, irrespective of the device type, a general goal has been to increase efficiency while maintaining or reducing relative costs.

Among the approaches which have been considered for improving photovoltaic devices is the introduction of another semiconductor layer into the device to form an additional rectifying interface with a resultant increase in developed voltage. In one example of this approach an electrolytic device having a semiconductor anode and an inert counterelectrode such as platinum, is modified by replacing the platinum counterelectrode with a semiconductor cathode. The potential advantage of this approach is that an additional rectifying junction is formed (electrolyte-cathode interface) which provides an opportunity to increase the voltage developed by the cell.

Implementation of this type modification has been reported. One contemplated scheme is the work of A. J. Nozik (See *Applied Physics Letters*, 29, 150 (1976)). Instead of using a platinum counterelectrode with a semiconductor anode of n-GaP in an electrolyte cell, a p-GaP cathode was employed. With this substitution increased efficiencies were observed after the addition of the p-GaP. (Ibid FIG. 2.)

Other avenues of improving devices by introducing an additional semiconductor material have also been tried. A second possible improvement scheme is the addition of a semiconductor material onto a semiconductor material already present in the device. For example, Morisaki et al (*Applied Physics Letters*, 29, 338–40 1976)) modified a Pt/electrolyte/TiO$_2$ photoelectrochemical cell by backing the TiO$_2$ electrode with a Si p-n solar cell. In this method a rectifying junction was not formed between the semiconductor material present in the device, i.e., the TiO$_2$, and the added semiconductor materials, i.e., the added p-Si/n-Si. The voltage is increased by the P-Si/n-Si rectifying junction–the silicon homodiode does not interact with the TiO$_2$ to increase voltage. Since the silicon backs the TiO$_2$ this method has the advantage of usefully employing the incident light not absorbed by the TiO$_2$ thereby increasing the efficiency and voltage of the device.

Each of the two methods described within the general approach of introducing an additional semiconductor material into a device to improve its properties, has a separate advantage. The first method increases voltage by the addition of a single semiconductor material but this semiconductor must be illuminated separately. However, separate illumination is inefficient. The second method increases efficiency by adding semiconductor materials which utilize the energy already incident on a rectifying junction of the device. However, this method requires a separate independent photovoltaic device to augment the voltage. The first method increases voltage at the cost of efficiency but requires the addition of a single semiconductor layer. The second method efficiently augments voltage but at the increased cost of an additional device.

SUMMARY OF THE INVENTION

It has been found that the efficiency and developed voltage of a photovoltaic device containing a semiconductor layer is significantly increased by interfacing this semiconductor layer with an additional semiconductor material of like conductivity type. For example, the solar power conversion efficiency and voltage of an electrolytic cell made by immersing an n-CdS electrode in a polysulfide electrolyte is increased up to about 92% and 70%, respectively, by adding an n-GaAs layer directly to the n-CdS. This represents a substantial increase in efficiency and voltage for the relatively acceptable incremental cost of the single n-GaAs layer. Further, it should be noted that although this discussion and the thrust of present research has been in terms of increased voltage and efficiency with decreased costs, the devices of this invention are useful even out of this context where increased voltage is the significant factor and efficiency and cost are subsidiary considerations.

The addition of the n-GaAs forms a rectifying isotype heterodiode with the n-CdS. The voltage of this isotype heterodiode is added to the voltage already obtained through the n-CdS/electrolyte rectifying junction. Thus, by adding a singe semiconductor layer the voltage of an additional diode is gained while illuminating a single surface area.

The technique of increasing device efficiency by adding a single semiconductor material to form an isotype heterodiode is generally applicable to all types of photovoltaic devices. Thus, other types of devices containing semiconductor materials are also susceptible to the addition of an isotype heterodiode by the use of a single semiconductor layer.

DETAILED DESCRIPTION

Figure 1:
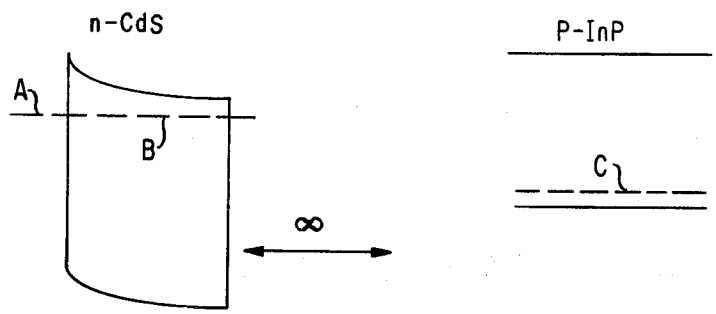
FIGS. 1 and 2 illustrate the behavior of a p-n junction when associated with an additional rectifying junction.

The devices of the invention are entities unto themselves. However, for purposes of description and elucidation, the inventive devices are described in terms of a prototype device or a device to be improved and in terms of the improved or inventive device, i.e., the device obtained by adding additional semiconductor materials to the prototype device.

Given a device containing a semiconductor layer, the efficiency of the device is improved by forming an isotype heterodiode between the semiconductor already in the device and another additional semiconductor. For example, if the device to be improved is a Pt/electrolyte/n-CdS electrolytic cell, the n-CdS is the semiconductor layer already in the device. Efficiency and voltage improvement is realized by forming an isotype heterodiode between the n-CdS and an added semiconductor layer, e.g., n-GaAs. In this example, the isotype heterodiode, i.e., n-CdS/n-GaAs, contributes to the efficiency of the improved overall device, i.e., the Pt/electrolyte/n-CdS/n-GaAs cell.

The successful addition of a semiconductor to improve efficiency by forming an isotype heterodiode with a semiconductor material of the device to be improved, entails the recognition of certain requirements. First, in any photovoltaic device the constituent materials are chosen so that incident light causes charge formation within a diffusion length of the interface. For example, in an electrolytic cell, the electrolyte is chosen to be as transparent as possible to solar light. Solar light incident on the electrolyte passes through unabsorbed and is available to the semiconductor electrode for absorption. This absorption produces charge carriers near the electrolyte-electrode interface. Similarly, in a Schottky barrier, when a metal is used, only a very thin coating, e.g., about 50 Angstroms, is employed. Incident light is not significantly absorbed in the metal but passes through to the semiconductor layer. Other devices also work on the same principle. In a heterodiode one of the semiconductor layers is chosen with a bandgap which is significantly smaller than that of the other semiconductor material. The larger bandgap material is illuminated. Only light of energy higher than this larger bandgap is absorbed; the remainder passes through and absorption occurs near the interface in the smaller bandgap material.

When making the improved devices of this invention, it is again desirable to produce charges near the newly formed interface. To achieve this result the smallest bandgap semiconductor material of the device to be improved is interfaced with an additional semiconductor layer having an even smaller bandgap. Light with energy lower than the smallest bandgap passes through the device and is absorbed near the new interface in the added semiconductor material. In this way, with broad spectrum incident radiation, charges are formed within a diffusion length of each interface of the improved device.

The currents generated in the device semiconductor and the added semiconductor upon illumination in essence are currents in series. The total current is limited to the smaller of the two photocurrents. Therefore, it is generally desirable that for illumination with a given spectrum of light the photocurrent produced in the added semiconductor be at least 10 percent of that produced in the device semiconductor.

Figure 2:
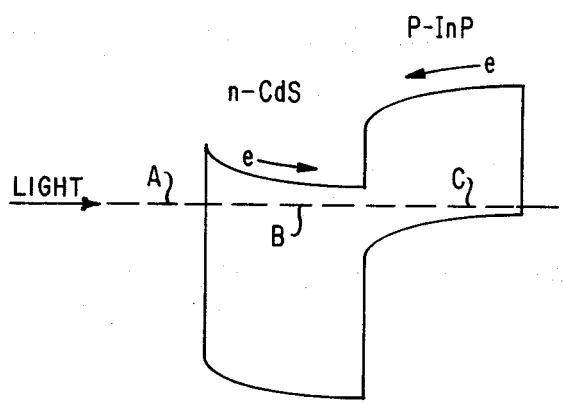

The semiconductor added for the improvement of semiconductor containing devices must satisfy other requirements besides the bandgap criterion. For example, indium phosphide has a smaller bandgap than CdS. However, it has been found that a Pt/polysulfide solution/n-CdS electrolytic cell is not improved by addition of a p-InP layer to the n-CdS. It has been found that this phenomenon involves the band bending in the completed device. In FIG. 1 there is shown a band diagram representing the CdS and electrolyte portions of a Pt/electrolyte/n-CdS device and an isolated p-InP material. The ordinate is energy with respect to the vacuum level and the abscissa is distance in space. The dotted line, A, represents the redox level of the electrolyte, B represents the Fermi level of the n-CdS, and C the Fermi level of p-InP. When a combined n-CdS/p-InP electrode is put in an electrolyte, the new device has the band structure shown in FIG. 2. When illuminated, electrons are formed in the n-CdS and the P-InP. These electrons move to lower potential in the direction indicated in FIG. 2. Thus, the electron flow in the n-CdS opposes the flow in the p-InP and the net result is that no power is produced. Similarly the holes concurrently produced are in opposition.

Figure 3:
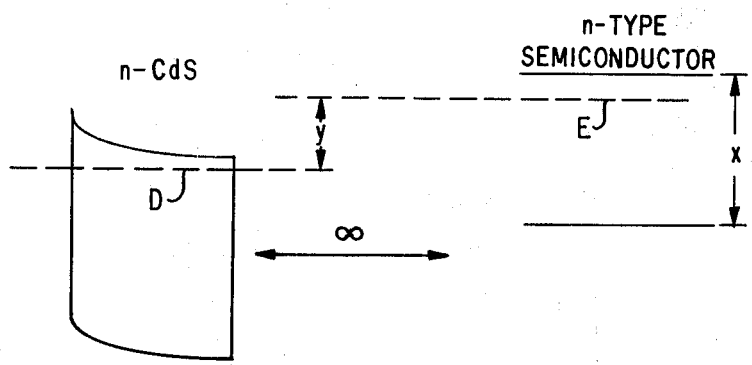
FIGS. 3, 4, 5, 6, and 7 indicate the characteristics of an isotype heterodiode when associated with another rectifying junction.

When improving a device by forming a heterodiode, advantageous effects are, however, obtained under certain specific circumstances. These circumstances are (1) that the added semiconductor has the same majority carrier type as the semiconductor of the device, i.e., there is an isotype heterodiode and (2) that the electrochemical potential of the majority carriers in the device semiconductor is smaller than the electrochemical potential that the majority carriers of the added semiconductor material have before this semiconductor material is interfaced with the device semiconductor. The larger the difference between the electrochemical potential of the majority carriers in the device semiconductor and the added semiconductor the greater voltage developed. For certain applications such as solar power conversion differences of at least 0.3 eV are preferred. The improvement achieved under these specific conditions (conditions (1) and (2)) can be elucidated in terms of the explanation for failure of the Pt/electrolyte/n-CdS/p-InP cell. In FIG. 3 there is shown a electrolyte/n-CdS device and a semiconductor which in isolation satisfies the above enumerated criteria as applied to n-CdS. The Fermi level of the added semiconductor material, E, is higher than that of the Fermi level of the n-CdS, D. Electrochemical potential as measured from the vacuum level for electrons (the majority carrier in this illustration) is a negative quantity. Therefore the relative positions of the Fermi levels in FIG. 3 indicate a smaller electrochemical potential for the majority carriers in n-CdS than in the added semiconductor. Thus the criteria are satisfied.

Figure 4:
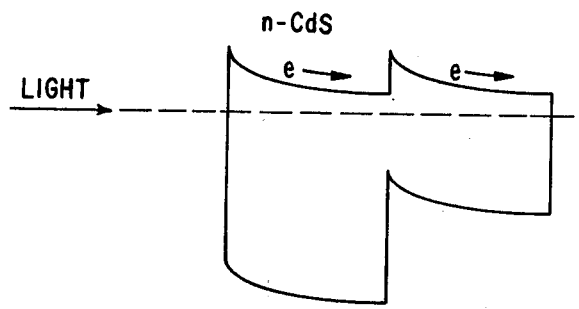

When the junction is made between the added semiconductor material and the device semiconductor material, band bending occurs. This is illustrated in FIG. 4. Again arrows are used to indicate the energetically favored direction of flow for electrons generated upon illumination. (The holes, of course, flow in the opposite direction.) Unlike the situation depicted in FIG. 2 when the device is illuminated, the electrons produced do not flow in opposite directions. Power is obtained both from the original device and from the newly formed isotype heterodiode.

Figure 5:
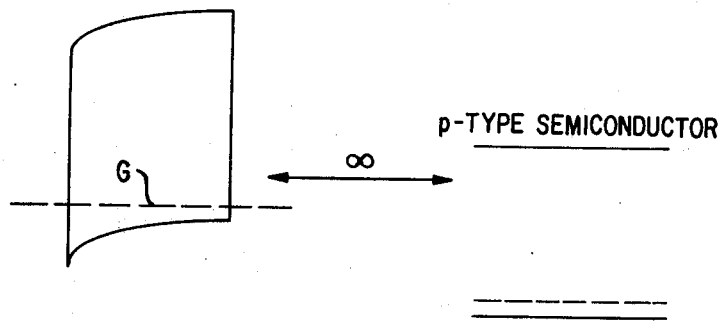
Figure 6:
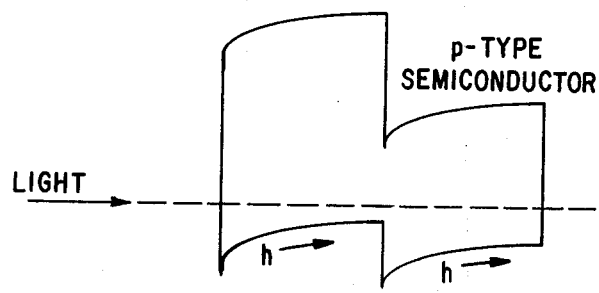

The explanation above also applies to the situation where the device is to be improved contains a p-type semiconductor. This situation is illustrated in FIGS. 5 and 6. Since electrochemical potential for holes (the majority carrier) is positive as measured from the vacuum level, the electrochemical potential of the majority carriers in the device semiconductor (as shown by the Fermi level, G) is smaller than that for the added p-type semiconductor. As shown in FIG. 6 when the new interface is made and the device is illuminated, the holes flow in the same direction.

Although for pedagogical purposes the illustrations have used electrolytic cells, the invention is not so limited. It is clear that the situation is the same whether the device to be improved is a heterodiode, homodiode or Schottky barrier. The devices of the invention also have application for optical switching. For example, a device represented by FIG. 4 (with a layer of GaAs) is useful for this purpose. If only light of energy higher than the bandgap of n-CdS is incident on the device electron-hole pairs are generated only in the n-CdS, not in the n-GaAs. Thus the circuit is not completed and no current flows. However, if light with energy below the bandgap of n-CdS but above the bandgap of n-GaAs is added, electrons are generated both in the n-CdS and in the n-GaAs and current flows. Current, in this situation, flows only when light of two different, specific energies are present. Therefore the device is useful as an "and" switch.

Figure 7:
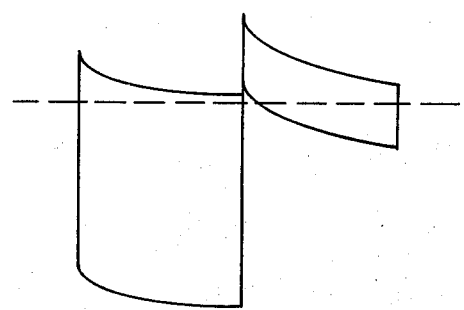

Although the essential criteria for the invention are stated above, two further caveats are necessry. The absolute value of the difference between the electrochemical potential of the majority carriers in the device semiconductor and the isolated added semiconductor must be smaller than the bandgap of the added semiconductor material. For example, in FIG. 3 the electrochemical potential difference Y should be less than X. If this requirement is not satisfied, situations exemplified by FIG. 7 occur. Such a situation causes a disadvantageous crossing of the conduction band of the device semiconductor with the valence band of the added semiconductor. Additionally sufficient interface states should be present at the added semiconductor-device semiconductor interface to allow recombination of generated holes and electrons. This condition is typically present in any such semiconductor interface either through lattice mismatch or through residual impurities such as oxygen on the junction materials.

The following example illustrates the results obtainable with devices within the scope of the invention.

EXAMPLE

Two polysulfide electrolytes were prepared. (See Ellis, *Journal of the American Chemical Society*, 96, 1635–7 (1976)). A concentrated solution was prepared from 13.45 g $Na_2S$, 6.9 g NaOH, and 5.5 g S (yellow rhombic modification) in 172 ml of water. A dilute solution was also prepared by dissolving 9.08 g $Na_2S.9-H_2O$, 1.51 0.24 g S (yellow rhombic modification) in 380 ml of water. Each solution was made by first adding all the solids to about 20% of the total water. The mixture was agitated and stirred until all the sulfur was dissolved. Then the remainder of the water was added.

A platinized platinum electrode was prepared by the method of Feltham and Spiro, *Chemical Reviews*, 71, 177–93 (1971). A blank platinum sheet of about 8 $cm^2$ total surface area was cleaned for 1 minute in cold aqua regia, and rinsed in distilled water. The sheet was inserted as a cathode into an electrolyte consisting of 15 ml of 15% aqueous solution of hexachloroplatinic acid, 3 ml concentrated HCl, 1 mg lead acetate, and 4 ml of water. The anode was a 20 ml diameter silver wire coil which had been chloridized anodically in concentrated HCl. The black Pt electrode was platinized at a current density of 10 mA $cm^{-2}$ for 10 minutes, then at 25 mA $cm^{-2}$ until no further blackening of the Pt was observed.

Anodes of n-CdS/n-GaAs and of p-InP/n-CdS were made. The n-CdS/n-GaAs anode was fabricated by first etching a silicon doped n-GaAs wafer with a majority carrier concentration of $6 \times 10^{16}$ cm $^{-3}$ (purchased from Laser Diodes, Ingot No. 6507, cut to expose the (111) faces) for 1 minute in a solution of 2 volume percent of bromine in methanol. The wafer was then rinsed in methanol and oriented for deposition on the (111)A face. Approximately 25 $\mu$m of n-CdS was deposited in vacuum on the n-GaAs by an evaporation process using a coaxial isothermal source described in *Applied Physics Letters*, 22, 351 (1973) and *Journal of Applied Physics*, 45, 246 (1974). The coaxial source was heated to between 347 and 357 degrees C and the GaAs substrate to between 255 and 284 degrees C. Similarly, as described in copending application Ser. No. 672,878 filed Apr. 2, 1976, and now U.S. Pat. No. 4,081,290, and in Wagner et al, *Applied Physics Letters*, 26, 229 (1975), a p-InP/n-CdS anode was prepared by depositing n-CdS on a p-InP wafer (111)B face). Both anodes were annealed for 15 minutes at 550 degrees C. in flowing forming gas (15% $H_2$+85% $N_2$). This produced a layer of n-CdS with a majority carrier concentration of $5 \times 10^{18}$ cm$^{-3}$. A Au/Zn/Au contact was evaporated onto the p-InP and n-GaAs and was sintered at 475 degrees C. A wire lead was attached to the Au/Zn/Au contacted p-InP and n-GaAs with In solder. The entire anode except in each case the n-CdS face was encapsulated in epoxy to prevent short circuits between the electrolyte and the p-InP, n-GaAs, or the lead wire.

Cells were prepared by immersing the platinum electrode and either the p-InP/n-CdS or n-CdS/n-GaAs electrode in the dilute polysulfide electrolyte. Light from an Air Mass 2 solar simulator (a tungsten-iodine lamp at 3200 K with a Schott KG-2 filter, bandpass filter which has 50 percent transmission points at approximately 0.2 $\mu$ and 0.8 $\mu$) was directed in each case onto the exposed n-CdS surface. The cell containing the p-InP/n-CdS showed no power development. The cell with the n-CdS/n-GaAs electrode showed a solar power conversion efficiency of approximately 2.5%.

An n-CdS/Mo electrode was also prepared by evaporation of CdS on molybdenum with the coaxial isothermal source. A wire was attached to the Mo and all the anode except the n-CdS face was encapsulated in eopxy. A cell was prepared by immersing the n-CdS/Mo anode and Pt cathode in a polysulfide electrolyte.

Figure 8:
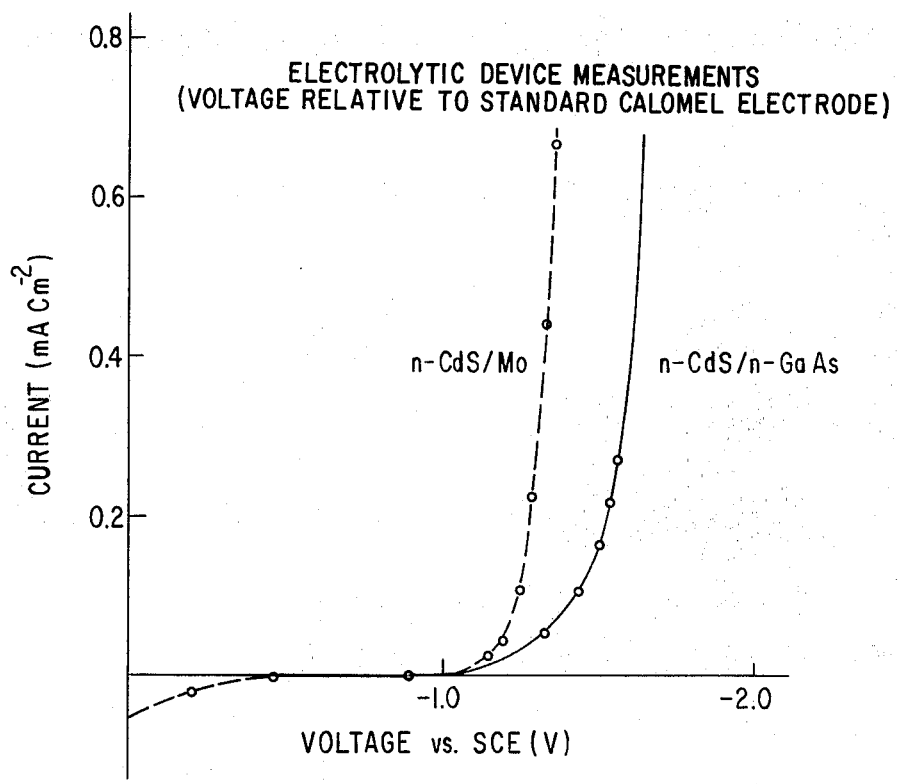
FIGS. 8, 9, and 10 illustrate the electrical properties of devices within the scope of the invention.
Figure 9:
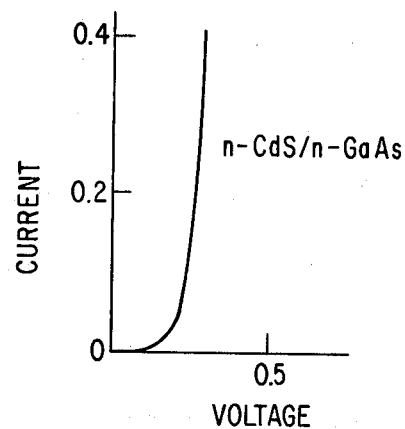
Figure 10:
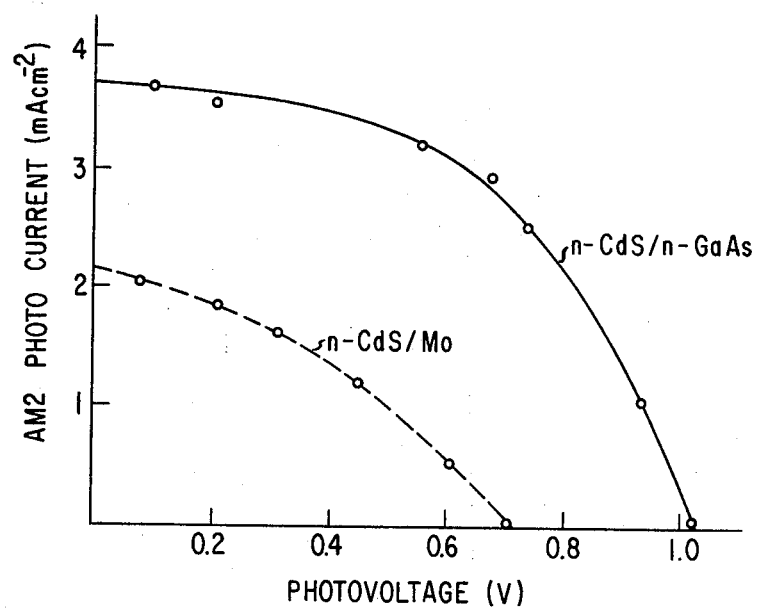

The current voltage characteristics measured in the dark for the n-CdS/Mo and n-CdS/GaAs cells in the concentrated electrolyte are shown in FIG. 8. When this was compared to the dark current of an n-CdS/n-GaAs device, FIG. 9, the series character of the electrolyte/CdS and CdS/GaAs diodes in the inventive device was apparent. Cells were also made by immersing the CdS/Mo or the CdS/GaAs anodes in the dilute electrolyte. The CdS surfaces in these The electrical characteristics obtained are shown in FIG. 10. The solar power conversion efficiency measured by comparison to a standardized silicon solar cell was approximately 2.5% for the n-CdS/n-GaAs containing cell and 0.7% for the n-CdS/Mo cell. Thus an efficiency increase of about 257% was realized by adding an n-GaAs semiconductor layer to a Pt/electrolyte/n-CdS device. Indeed, the measured efficiency of the n-CdS/n-GaAs containing cell was 92% greater than what was believed the best efficiency yet reported for a CdS anode electrolyte cell. (See Heller et al, *Journal of the Electrochemical Society*, 129, 697 (1977) where an efficiency of 1.3% and a voltage of 0.6V is disclosed.) Further the n-CdS/n-GaAs containing cells showed a voltage of 1.02V as compared to the measured 0.70V for a CdS/Mo anode and the 0.60V measured by Heller et al. This corresponds to an increase in voltage of 46 and 70% respectively.

What is claimed is:

1. A device with enhanced voltage characteristics which is responsive to solar light comprising a first semiconductor material having a surface forming a rectifying junction with an interfacing material chosen from the group consisting of electrolytes, semiconductors, and Schottky barrier forming materials such that when solar light is incident on said interfacing material whose surface is adapted to accept said solar light a generated voltage is developed between said interfacing material and said first semiconductor material characterized in that a second semiconductor material of the same majority carrier type as said first semiconductor material and with a smaller bandgap than said first semiconductor material forms a junction with said first semiconductor material on another surface thereof apart from said surface forming said rectifying junction; wherein the electrochemical potential of the majority carriers in said first semiconductor material is smaller than the electrochemical potential of the majority carriers of said second semiconductor material in isolation and wherein the absolute value of the difference between the electrochemical potential of the majority carriers in said first and said second semiconductor material in isolation is smaller than the bandgap of said second semiconductor material, whereby when said solar light is incident on said interfacing material, majority and minority carriers are generated both in said first semiconductor material and in said second semiconductor material, thereby giving a voltage higher than said generated voltage and thereby giving currents from said generated carriers in said first and second semiconductor material which are currents in series.

2. The device of claim 1 wherein said first semiconductor material is n-CdS.

3. The device of claim 1 wherein said second semiconductor material is n-GaAs.

4. The device of claim 3 wherein said interfacing material is an electrolyte.

5. The device of claim 1 wherein said interfacing material is an electrolyte.

6. The device of claim 1 wherein said first semiconductor material is n-CdS, and said second semiconductor material is n-GaAs.

7. The device of claim 8 wherein said interfacing material is an electrolyte.

8. The device of claim 7 wherein said electrolyte comprises a polysulfide.

* * * * *

UNITED STATES PATENT AND TRADEMARK OFFICE
CERTIFICATE OF CORRECTION

PATENT NO. : 4,196,263

DATED : April 1, 1980

INVENTOR(S) : Joseph L. Shay and Sigurd Wagner

It is certified that error appears in the above-identified patent and that said Letters Patent are hereby corrected as shown below:

Column 4, line 49, after "device" delete "is". Column 5, line 10, "necessry" should read --necessary--. Column 5, line 38, after "1.51" insert --g NaOH, and--. Column 6, line 33, "eopxy" should read --epoxy--. Column 6, line 44, after "these" insert --cells were illuminated by a simulated Air Mass 2 source.--. Column 8, line 18, claim 7, "8" should read --6--.

Signed and Sealed this

Twenty-eighth Day of April 1981

[SEAL]

Attest:

RENE D. TEGTMEYER

Attesting Officer

Acting Commissioner of Patents and Trademarks